(12) United States Patent
Butzmann

(10) Patent No.: US 7,602,176 B2
(45) Date of Patent: Oct. 13, 2009

(54) AMR SENSOR ELEMENT FOR ANGLE MEASUREMENT

(75) Inventor: Stefan Butzmann, Hagen (DE)

(73) Assignee: NXP B.V., Eindhoven (NL)

( * ) Notice: Subject to any disclaimer, the term of this patent is extended or adjusted under 35 U.S.C. 154(b) by 146 days.

(21) Appl. No.: 10/585,061

(22) PCT Filed: Dec. 20, 2004

(86) PCT No.: PCT/IB2004/052863

§ 371 (c)(1),
(2), (4) Date: Apr. 24, 2007

(87) PCT Pub. No.: WO2005/075943

PCT Pub. Date: Aug. 18, 2005

(65) Prior Publication Data

US 2008/0043381 A1     Feb. 21, 2008

(30) Foreign Application Priority Data

Jan. 7, 2004     (EP) .................. 04100021

(51) Int. Cl.
*G01B 7/30* (2006.01)
*G01R 33/09* (2006.01)

(52) U.S. Cl. ............ 324/207.25; 324/207.21; 324/249; 324/252

(58) Field of Classification Search ............ 324/207.2, 324/207.25, 252, 207.21, 249; 73/514.31, 73/514.39; 360/324–327, 313–316
See application file for complete search history.

(56) References Cited

U.S. PATENT DOCUMENTS

| | | | |
|---|---|---|---|
| 5,396,519 A | 3/1995 | Betts | |
| 6,243,425 B1 | 6/2001 | Langberg | |
| 6,493,399 B1 | 12/2002 | Xia | |
| 6,584,144 B2 | 6/2003 | Alamouti | |
| 6,928,107 B1 | 8/2005 | Olafsson | |
| 6,987,803 B2 | 1/2006 | Frenkel | |
| 7,133,465 B2 | 11/2006 | McLaughlin | |
| 7,149,238 B2 | 12/2006 | Agee | |
| 7,190,734 B2 | 3/2007 | Giannakis | |
| 7,200,180 B2 | 4/2007 | Verbin | |
| 2002/0149358 A1* | 10/2002 | Doescher | 324/207.21 |
| 2003/0072380 A1 | 4/2003 | Huang | |
| 2005/0032521 A1 | 2/2005 | Lee | |
| 2005/0147183 A1 | 7/2005 | Willink | |
| 2005/0201307 A1 | 9/2005 | Chae | |
| 2005/0213686 A1 | 9/2005 | Love | |

(Continued)

OTHER PUBLICATIONS

Gresset, N, et al., "Linear precoding under iterative processing for multiple antenna channels," First Int. Symp. Control, Comm. and Signal Proc., 2004, pp. 563-566.

(Continued)

*Primary Examiner*—Bot L LeDynh

(57) ABSTRACT

In order to provide a magneto-resistive angle sensor (100) comprising a sensor device for detecting an angle ($\alpha$) of an external magnetic field relative to a reference axis of the sensor device, which allows measurement of the angle ($\alpha$) without the measurement result being affected by manufacturing errors, it is proposed that the sensor device comprises a flat AMR layer (14, 15) with one electrical contact ($K_0$) for applying a current (I) and a plurality of electrical contacts ($K_i$) for measuring a flow of current through the AMR layer (14, 15).

8 Claims, 3 Drawing Sheets

U.S. PATENT DOCUMENTS

Figure 1:
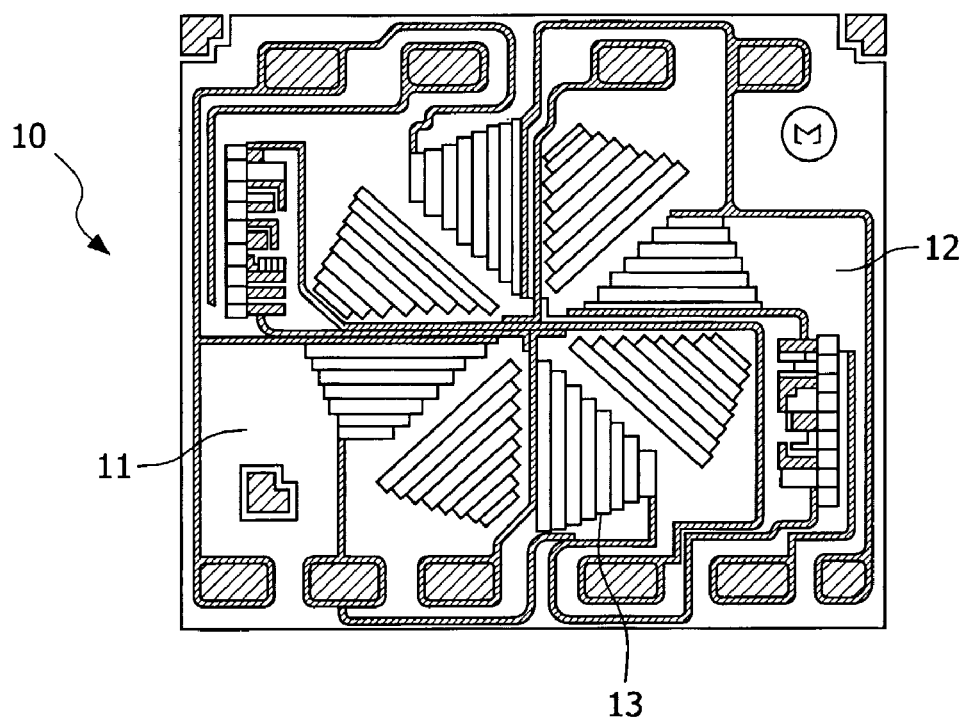

| | | |
|---|---|---|
| 2005/0237920 A1 | 10/2005 | Howard |
| 2005/0281350 A1 | 12/2005 | Chae |
| 2005/0281351 A1 | 12/2005 | Jeong |
| 2005/0281357 A1 | 12/2005 | Bouvet |
| 2005/0286663 A1 | 12/2005 | Poon |
| 2006/0023803 A1 | 2/2006 | Perlman |
| 2006/0029157 A1 | 2/2006 | Dabak |
| 2006/0039489 A1 | 2/2006 | Ikram |
| 2006/0120478 A1 | 6/2006 | Kim |
| 2006/0198459 A1 | 9/2006 | Fischer |
| 2006/0210070 A1 | 9/2006 | Reznik |
| 2006/0234645 A1 | 10/2006 | Lin |
| 2006/0281421 A1 | 12/2006 | Pan |
| 2007/0014378 A1 | 1/2007 | Parhi |

OTHER PUBLICATIONS

Barreto, A.N., "Joint signal precoding in the downlink of spread-spectrum systems," IEEE Trans. Wireless Comm., vol. 2, No. 3, May 2003, pp. 511-518.

Hjorungnes, A., "Precoding of Orthogonal Space-Time Block Codes in Arbitrarily Correlated MIMO Channels: Iterative and Closed-Form Solutions," IEEE Trans. Wireless Comm., Vol.

Skjevling, H., et al., "Precoding for Distributed Space-Time Codes in Cooperative Diversity- Based Downlink," Proc. IEEE Int. Conf. on Comm., ICC 2006, Istanbul, Turkey, Jun. 20.

Hjorungnes, A., "Exact SER-Precoding of Orthogonal Space-Time Block Coded Correlated MIMO Channels: An Iterative Approach," Proc. 6th IEEE Nordic Sig. Proc. Symp., NORSIG 2004.

Castro, P.M., et al., "Adaptive precoding in MIMO wireless communication systems using blind channel prediction over frequency selective fading channels," 13th Workshop on Sta.

* cited by examiner

AMR SENSOR ELEMENT FOR ANGLE MEASUREMENT

The invention relates to a magneto-resistive angle sensor having a sensor device for detecting an angle α of an external magnetic field relative to a reference axis of the sensor device.

Magnetoresistive sensors are usually used to detect angles in motor vehicle technology in order, inter alia, to monitor and control the position of a pedal or the position of a throttle. In this case, a magnetoresistive angle sensor usually consists of two Wheatstone bridges which are offset by 45° with respect to one another, said bridges being exposed to an external magnetic field. The two bridges respectively supply, as a function of an angle α of the external magnetic field relative to a reference axis of the sensor or of the sensor device formed by the bridges, angle-dependent voltage output signals which can be shown in a manner known to the person skilled in the art using the following relation:

$$U_1 = U_0 \sin(2\alpha)$$

$$U_2 = U_0 \cos(2\alpha)$$

Here, $U_1$ and $U_2$ are the voltage output signals of the two bridges, $U_0$ is the voltage amplitude of the output signal, which depends inter alia on the ambient temperature, and α is the angle of the external magnetic field relative to the reference axis of the sensor device.

The angle α of the external magnetic field relative to the sensor or to the bridges is calculated from these output signals, for example using the CORDIC algorithm. In order to implement this algorithm, the analog output signals of the bridges must be converted into digital signals by means of an analog/digital converter.

The angle α of the external magnetic field relative to the sensor is then determined using the likewise known relation:

$$\alpha = \frac{1}{2} \arctan(U_1/U_2) = \frac{1}{2} \arctan(\sin(2\alpha)/\cos(2\alpha))$$

for example using digital signal processing means suitable for this purpose. Taking account of the sign of the output voltage $U_2$, the angle α can be calculated with extremely high accuracy using the arctan function over 180°.

The Wheatstone bridges for forming a sensor device are usually designed in the form of resistors arranged in a meandering manner in an AMR layer. One disadvantage here is that relatively great offset signals are generated on account of manufacturing tolerances during etching of the meandering resistor structures, and these offset signals are included directly in the angle measurement as errors. Particularly at the edges of the meandering structures, undercuts may be produced which cause a strong offset signal. When evaluating the output signals obtained from the bridges, this offset has to be taken into account by means of a technically complex evaluation unit.

In an example embodiment, a magneto-resistive angle sensor which on account of its design has a considerably smaller offset signal and thus allows more accurate measurements, wherein the output signal can be fed directly for evaluation. The magneto-resistive angle sensor includes a sensor device for detecting and angle (α) of an external magnetic field relative to a reference axis of the sensor device. Included in the sensor device is a flat anistropic magneto-resistive (AMR) layer with one electrical contace ($K_o$) for applying a current. A plurality of electrical contacts ($K_i$) measure a flow of current through the AMR layer.

The core concept of the invention is that the plurality of meandering resistors of a Wheatstone bridge are replaced by a single, continuous and flat AMR layer, wherein the AMR layer has one electrical contact for applying a current. Furthermore, a plurality of electrical contacts are formed on the AMR layer in order to be able to detect a flow of current from the aforementioned electrical contact in each case to one of the plurality of electrical contacts. This makes use of the fact that, when an external magnetic field is applied, the AMR has its greatest electrical resistance in the direction in which an external field is being applied. Accordingly, it has its lowest resistance perpendicular to this direction of the external magnetic field. Therefore, by determining the flows of current between the plurality of electrical contacts and the one electrical contact for supplying an electrical current, the direction of the external magnetic field relative to the AMR layer can be determined by determining that contact through which the least current flows.

The outer shape of the AMR layer may essentially be selected at will. It is preferably designed in the manner described below. The number of electrical contacts for measuring a flow of current may also essentially be selected at will, and in theory an unlimited number of electrical contacts may be provided. The distance of the plurality of electrical contacts from the one electrical contact for applying a current must be selected to be great enough to achieve a sufficient flow of current perpendicular to the direction of an external magnetic field.

The advantage of the invention consists in that, by virtue of the flat design of the magnetoresistive AMR layer, undercuts at the edge of the AMR layer have virtually no effect on the measurement result since the length of the edge compared to the surface area of the AMR layer is significantly smaller than in the case of the known meandering structures of a Wheatstone bridge. As a result, the output signals are virtually no longer falsified or provided with an offset signal.

Advantageous developments of the invention are characterized in the dependent claims.

Having a magneto-resistive angle sensor with the sensor device a circular AMR layer means that the sensor device is designed to be symmetrical in relation to all possible orientations of the external magnetic field. The sensor device or the magnetoresistive angle sensor equipped therewith can thus detect any angle between the external magnetic field and the circular AMR layer.

In circular AMR layer, the electrical contact for applying a current is arranged in the center. A symmetrical design of the sensor device formed in this way is thereby achieved, wherein the magnetic flux flowing through the AMR layer, particularly when there are further electrical contacts arranged at the edge of the circular AMR layer as claimed in claim 4, respectively passes through an equal-length path of the AMR layer from the central contact to the edge contacts, regardless of the orientation of the external magnetic field. In this example embodiment, the plurality of electrical contacts at the edge are preferably arranged so that they are distributed equidistantly around the edge. In one example embodiment, eight electrical contacts are provided at the edge. This allows a sufficiently precise resolution of the angle between the external magnetic field and an imaginary reference axis of the sensor device by extrapolating the measurement results. On account of the 180° periodicity of the AMR layer over the angle of the external magnetic field, it is particularly advantageous to add the current flowing through in each case two opposite edge contacts in order in this way to obtain four difference current signals. A first current signal is obtained by the currents flowing through the edge contacts 1 and 5, a second current signal is obtained by the currents flowing through the contacts 2 and 6, a third current signal is obtained by the currents flowing through the contacts 3 and 7 and a fourth current signal is obtained by the currents flowing through the contacts 4 and 8. If the third difference current signal is subtracted from the first difference current signal and the fourth difference current signal is subtracted from the second difference current signal, two further current signals are obtained which, viewed over a 360° angular range, in each case have a sine or cosine form corresponding to the output voltages of a known Wheatstone bridge. The angle α between an external magnetic field and the sensor device can be deduced from these signals in a likewise known manner.

In another example embodiment, the AMR layer is designed to be essentially semicircular. As a result it is possible in particular to reduce the size of the sensor device, since only half the surface area of a full circle as described above is required. A semicircular design of the AMR layer is sufficient since, as mentioned above, the AMR layer has 180° periodicity in relation to the external magnetic field.

According to another example embodiment, the AMR layer when it is designed in a semicircular manner the electrical contact for applying a current is once again arranged in the center of the associated full circle or in the center of the straight side of the semicircle of the semicircular AMR layer.

Furthermore, in another example embodiment, a plurality of electrical contacts may be arranged at the edge of the semicircular AMR layer, in particular five electrical contacts, which are arranged at the semicircular edge of the layer and are distributed equidistantly with respect to one another. A sufficient resolution of the angle between the external magnetic field and the sensor device is thus possible. The above-described sine and cosine signals are in this case obtained by adding the current present across the first and fifth contacts minus the current present across the third contact or by subtracting the current present across the fourth contact from the current present across the second contact.

In order to improve the measurement accuracy of the magnetoresistive angle sensor, the plurality of electrical contacts may be placed at the same potential to avoid affecting the current intensities measured at the contacts. In particular, all the electrical contacts are placed at ground potential so that no fault currents flow and no error voltages are present.

In example embodiment, manufacture of the AMR layer by a person skilled in the art may be accomplished by applying a Permalloy layer to a silicon support substrate and providing the Permalloy layer with electrical contacts. By virtue of the above-described developments of the AMR layer, any undercuts of the Permalloy layer which occur at the edge of the AMR layer during manufacture are of virtually no consequence. Thus the measurement results of the sensor are not falsified.

It will be understood that such sensors can be used in all fields of technology in which it is desired to measure an angle of a rotating object. In an example embodiment, such sensors are used in motor vehicle technology to monitor and control the position of a pedal or the position of a throttle so as to regulate the power of an engine. The angular resolution of the angle between the external magnetic field and the sensor that can be achieved with such sensors is sufficient for applications in motor vehicle technology.

The invention will be further described with reference to two examples of embodiments shown in the drawings to which, however, the invention is not restricted.

Figure 2:
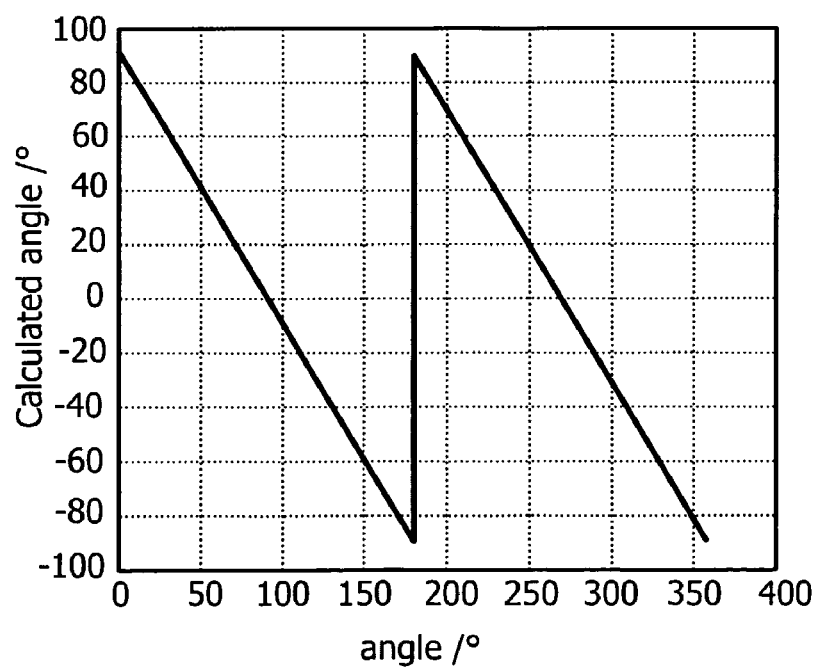
Figure 3:
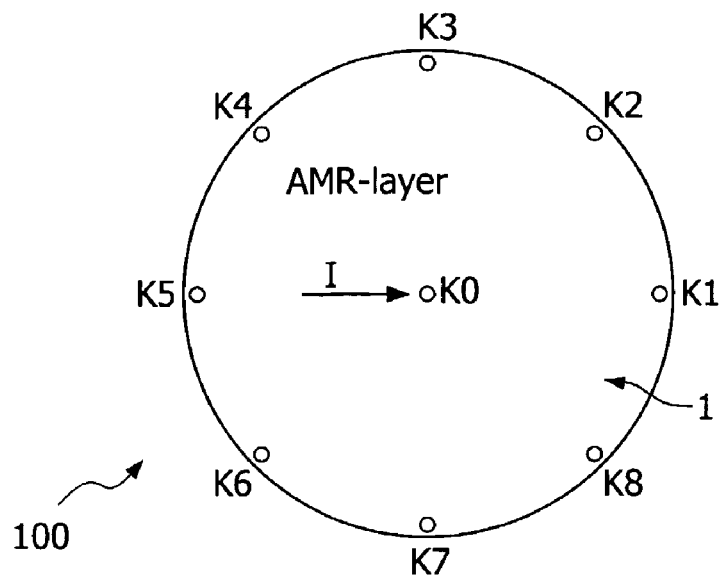
Figure 5:
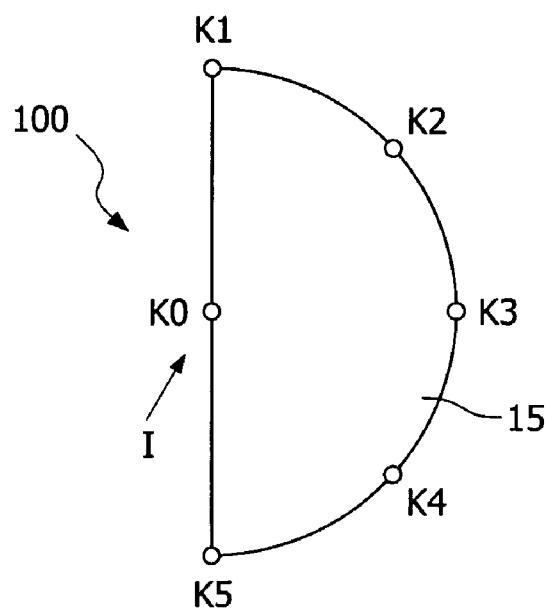
Figure 4:
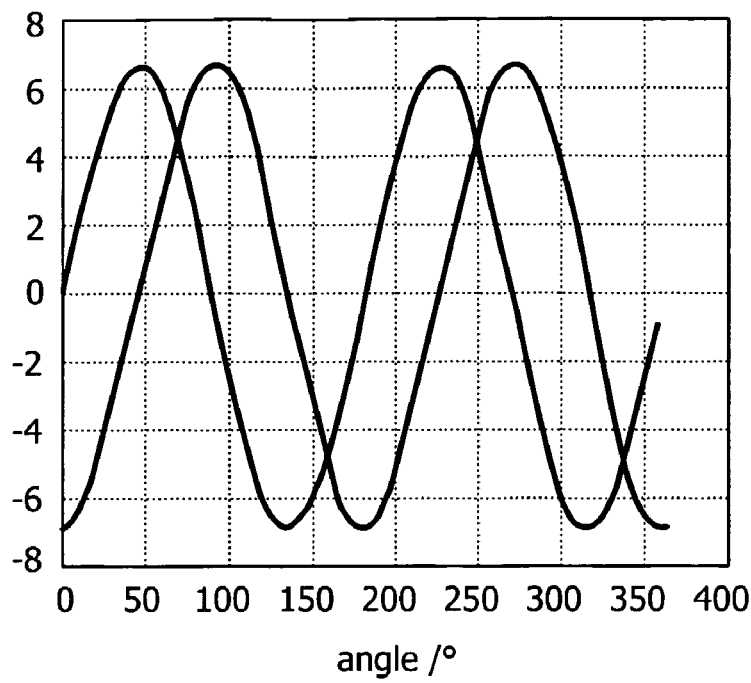
Figure 6:
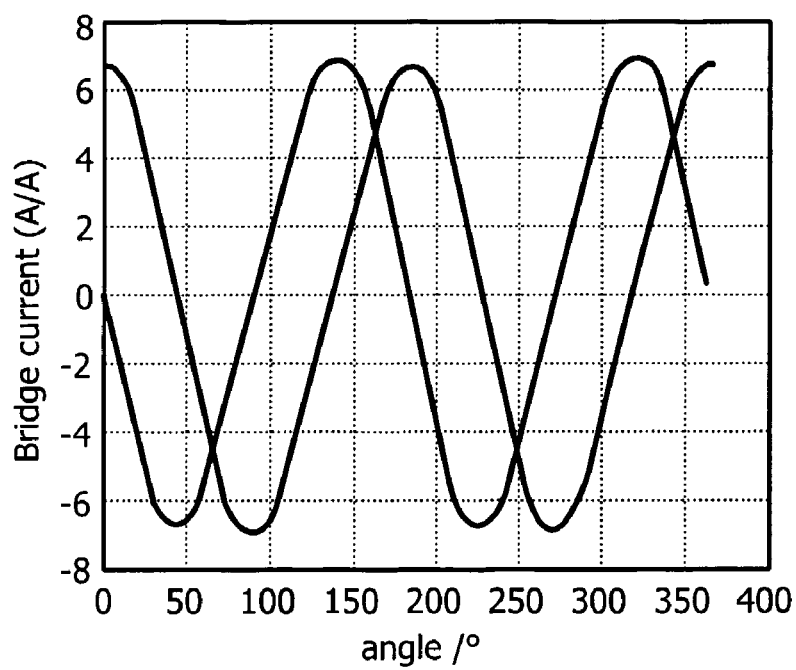

FIG. 1 shows an AMR angle sensor from the prior art.
FIG. 2 shows the calculated angle α of this sensor.
FIG. 3 shows a circular AMR sensor.
FIG. 4 shows current signals of this sensor.
FIG. 5 shows a semicircular AMR sensor.
FIG. 6 shows current signals of this sensor.

The AMR angle sensor 10 shown in FIG. 1 consists essentially of two Wheatstone bridges 11, 12 which are offset by 45° with respect to one another and are each composed of four meandering resistors 13. If this AMR angle sensor 10 is passed through by an external magnetic field, in each case an output voltage $U_1=U_0 \sin(2\alpha)$, $U_2=U_0 \cos(2\alpha)$ will be induced in a known manner at the two Wheatstone bridges 11, 12, wherein the angle α between the external magnetic field and the AMR angle sensor 10 or a reference axis in the AMR angle sensor 10 can be determined from these output voltages using the known CORDIC algorithm, as shown in FIG. 2.

FIG. 3 shows a magnetoresistive angle sensor 100 which essentially consists of a circular AMR layer 14, preferably a Permalloy layer on a silicon support substrate. Arranged in the center is a current contact $K_0$, through which a current I is passed into the AMR layer 14. Eight contacts $K_1$ to $K_8$ are arranged at the edge, distributed equidistantly around the circumference of the circular AMR layer 14, in order in each case to measure a flow of current between the central contact $K_0$ and an edge contact $K_i$. By virtue of the 180° periodicity of the AMR layer 14 over the angle of the external magnetic field, the currents flowing through the opposite contacts can be added in order in this way to obtain four current signals:

$$I_1=IK_1+IK_5$$

$$I_2=IK_2+IK_6$$

$$I_3=IK_3+IK_7$$

$$I_4=IK_4+IK_8$$

If $I_3$ is subtracted from $I_1$ and $I_4$ is subtracted from $I_2$, two new difference signals are obtained which each have the desired sine or cosine form over 360°, as shown in FIG. 4. Using the CORDIC algorithm known per se, the connection (shown in FIG. 2) between the angle α and the external magnetic field can in turn be calculated from these difference signals.

The alternative embodiment shown in FIG. 5 allows the magneto-resistive angle sensor 100 to be miniaturized since the semicircular AMR layer 15 takes up less space than a full-circle AMR layer 14. In this case, five contacts $K_1$ to $K_5$ are arranged in an equidistantly distributed manner around the semicircular edge of the AMR layer 15, in order in each case to obtain a flow of current between these contacts $K_i$ and the contact $K_0$ arranged in the center of the straight edge of the AMR layer 15. The above-described sine or cosine signals are then obtained by adding or subtracting the various signals as follows:

$$I_1=IK_1+IK_5-IK_3$$

$$I_2=IK_2-IK_4.$$

From these difference signals shown in FIG. 6 it is possible, again using the known CORDIC algorithm, to obtain the form of the angle α over 360° which is shown in FIG. 2.

The above-described operations can be carried out using electronic components known to the person skilled in the art.

LIST OF REFERENCES 100 magneto-resistive angle sensor
10 AMR angle sensor (prior art)
11 Wheatstone bridge
12 Wheatstone bridge
13 meandering resistor
14 circular AMR layer
15 semicircular AMR layer $K_0$ central current contact
$K_i$ edge current contact, i=1 to 8
α angle between a magnetic field and a sensor device
I current intensity
U voltage

The invention claimed is:

1. A magneto-resistive angle sensor comprising a sensor device for detecting an angle (α) of an external magnetic field relative to a reference axis of the sensor device, characterized in that the sensor device comprises a continuous, flat, circular AMR layer with one electrical contact for applying a current (I) arranged at the center of the AMR layer and a plurality of electrical contacts for measuring a flow of current through the AMR layer.

2. A magneto-resistive angle sensor comprising a sensor device for detecting an angle (α) of an external magnetic field relative to a reference axis of the sensor device, characterized in that the sensor device comprises a continuous, flat, semi-circular AMR layer with one electrical contact for applying a current (I) and a plurality of electrical contacts for measuring a flow of current through the AMR layer.

3. A magneto-resistive angle sensor as claimed in claim 2, wherein the electrical contact for applying a current is arranged in the center of an associated full circle.

4. A magneto-resistive angle sensor as claimed in claim 1, characterized in that eight electrical contacts are arranged equidistantly at the edge of the circular AMR layer.

5. A magneto-resistive angle sensor as claimed in claim 2, characterized in that five electrical contacts (Ki) are arranged equidistantly at the semicircular edge of the semicircular AMR layer.

6. A magneto-resistive angle sensor as claimed in claim 1, characterized in that the plurality of electrical contacts are placed at ground potential.

7. A magneto-resistive angle sensor as claimed in claim 1, characterized in that the AMR layer is a Permalloy layer applied to a silicon support substrate.

8. The use of a magneto-resistive angle sensor as claimed in claim 1 in motor vehicle technology, wherein the magneto-resistive angle sensor monitors the position of at least one of the following: pedal, throttle.

* * * * *